United States Patent [19]

Lingnau et al.

[11] Patent Number: 5,221,595
[45] Date of Patent: Jun. 22, 1993

[54] PHOTOPOLYMERIZABLE MIXTURE AND RECORDING MATERIAL PREPARED THEREFROM

[75] Inventors: Juergen Lingnau, Mainz-Laubenheim; Hans-Dieter Frommeld, Wiesbaden, both of Fed. Rep. of Germany

[73] Assignee: Hoechst Aktiengesellschaft, Frankfurt am Main, Fed. Rep. of Germany

[21] Appl. No.: 676,119

[22] Filed: Mar. 27, 1991

[30] Foreign Application Priority Data

Mar. 27, 1990 [DE] Fed. Rep. of Germany ....... 4009700

[51] Int. Cl.⁵ ............................................. G03C 1/73
[52] U.S. Cl. .................................... 430/281; 430/283; 430/284; 430/905; 430/906; 430/908; 430/916; 430/915; 430/917; 430/920; 522/26; 522/95; 522/121
[58] Field of Search ............... 430/920, 281, 283, 284, 430/905, 906, 908, 916, 917, 915; 522/26, 95, 121

[56] References Cited

U.S. PATENT DOCUMENTS

| | | | |
|---|---|---|---|
| 3,652,275 | 3/1972 | Baum et al. | 430/920 |
| 3,782,951 | 1/1974 | Lee et al. | 430/920 |
| 3,844,790 | 10/1974 | Chang et al. | 430/920 |
| 4,243,741 | 6/1981 | Abele et al. | 430/920 |
| 4,250,053 | 2/1981 | Smith | 252/426 |
| 4,311,783 | 1/1992 | Dessauer | 430/920 |
| 4,459,349 | 7/1984 | Tanaka et al. | 430/920 |
| 4,535,052 | 8/1985 | Anderson et al. | 430/920 |
| 4,555,473 | 11/1985 | Dueber et al. | 430/920 |
| 4,837,106 | 6/1988 | Ishikawa et al. | 430/920 |

FOREIGN PATENT DOCUMENTS 0138187 4/1985 European Pat. Off. .
55-75405 6/1980 Japan .

*Primary Examiner*—Jack P. Brammer
*Attorney, Agent, or Firm*—Foley & Lardner

[57] ABSTRACT

A photopolymerizable mixture is disclosed that contains a polymer binder, a polymerizable compound having at least one terminal ethylene double bond and a boiling point above 100° C. at normal pressure, a hexaarylbisimidazole and a 1,3-diarylpyrazoline or a 1-aryl-3-aralkenyl-pyrazoline. The mixture is suitable for the preparation of printing plates and photoresists and is distinguished by high photosensitivity and low sensitivity towards acid solutions.

17 Claims, No Drawings

PHOTOPOLYMERIZABLE MIXTURE AND RECORDING MATERIAL PREPARED THEREFROM

BACKGROUND OF THE INVENTION

The present invention relates to a photopolymerizable mixture that contains a polymer binder, a polymerizable compound having at least one terminal ethylenic double bond and a boiling point above about 100° C. at normal pressure and a photoinitiator combination. The mixture is suitable for the preparation of recording materials, in particular of printing plates and photoresists.

EP 138,187 discloses photopolymerizable mixtures that contain, as photoinitiators, a combination of a hexaarylbisimidazole with an N-heterocyclic compound substituted by p-dialkylaminophenyl groups. These substituted N-heterocyclic compounds have the disadvantage that they are readily soluble in acids and, for example, when used as plating resists are extracted from the acid baths and contaminate the latter.

JP 55/75 405 describes 2-pyrazoline derivatives having substituents in the 1-, 3-, 4- and/or 5-position as photoinitiators, which are optionally combined with compounds containing aromatic keto groups. These initiators and initiator combinations give mixtures which are not sufficiently photosensitive for use in practice.

DE 3,019,211 relates to sensitization of iodonium and sulfonium compounds, which act as photoinitiators, with polyarylpyrazolines. It also relates to combinations of these mixtures with monomers which can be polymerized by free radical polymerization. The photosensitivity of these mixtures is inadequate.

SUMMARY OF THE INVENTION

It is therefore an object of the present invention to provide a photopolymerizable mixture having a high photosensitivity and good image reproduction and which contains no constituents which are dissolved out from the photocured layer to an appreciable extent by acid processing baths.

In accordance with these and other objects of the present invention a photopolymerizable mixture is provided, which comprises, in admixture, (a) a polymer binder, (b) a polymerizable compound having at least one terminal ethylenic double bond and a boiling point above about 100° C. at normal pressure, (c) a hexaarylbisimidazole, and (d) a pyrazoline selected from the group consisting of 1,3-diarylpyrazoline and 1-aryl-3-aralkenyl-pyrazoline as a further photoinitiator. A photopolymerizable recording material comprising a coating of the photopolymerizable coating on a coating support is also described.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

According to the present invention, a photopolymerizable mixture contains, as essential constituents,
a) a polymer binder,
b) a polymerizable compound having at least one terminal ethylenic double bond and a boiling point above 100° C. at normal pressure,
c) a hexaarylbisimidazole, and
d) a further photoinitiator.

In the mixture according to the invention, the further photoinitiator is a 1,3-diarylpyrazoline or a 1-aryl-3-aralkenyl-pyrazoline.

The pyrazolines employed in the mixture according to the invention preferably have the formula I

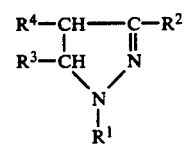

wherein
$R^1$ is a substituted or unsubstituted monocyclic to tricyclic aryl radical, preferably an optionally-substituted phenyl radical,
$R^2$ is a radical having the meaning of $R^1$ or is an optionally-substituted aralkenyl radical, in particular an optionally-substituted styryl radical,
$R^3$ is a hydrogen atom, an alkyl radical, preferably having 1 to 6 carbon atoms, or, preferably, a radical having the meaning of $R^1$, and
$R^4$ is a hydrogen atom or an alkyl radical, in particular having 1 to 4 carbon atoms, preferably a hydrogen atom.

Substituents in the radicals $R^1$ and $R^2$ may be lower alkyl groups, halogen atoms, $R^4O$, $R^4S$, CN or acylamino, aryl and acyloxy groups. Alkyl or alkoxy groups having 1 to 4 carbon atoms, in particular methyl or methoxy groups, or chlorine atoms, are preferred.

The pyrazoline is added in an amount of about 0.01 to 10%, preferably about 0.1 to 1%, based on the amount of polymerizable compounds.

Examples of suitable compounds of the formula I are:
1,3-diphenyl-2-pyrazoline,
1-p-methoxyphenyl-3-phenyl-2-pyrazoline,
1-phenyl-3-p-cyanophenyl-2-pyrazoline,
1-phenyl-3-styryl-2-pyrazoline,
1-naphthyl-3-phenyl-2-pyrazoline,
1-p-chlorophenyl-3-phenyl-2-pyrazoline,
1-m-chlorophenyl-3-(2,4-dimethoxyphenyl)-2-pyrazoline,
1-(3,4-dichlorophenyl)-3-phenyl-2-pyrazoline,
1-p-methylsulfonylphenyl-3-phenyl-2-pyrazoline,
-1-p-acetylaminophenyl-3-phenyl-2-pyrazoline,
5-isopropyl-1,3-diphenyl-2-pyrazoline,
1-p-tolyl-3-phenyl-2-pyrazoline,
1-p-methoxycarbonylphenyl-3-phenyl-2-pyrazoline,
1,3-diphenyl-5-p-acetylaminophenyl-2-pyrazoline,
1,3,5-triphenyl-2-pyrazoline,
1,5-diphenyl-3-styryl-2-pyrazoline,
1-phenyl-3- (p-methoxystyryl) -5-(p-methoxyphenyl)-2-pyrazoline,
1-phenyl-3-(2,4-dichlorostyryl)-5-(2,4-dichlorophenyl)-2-pyrazoline, 1-(p-methoxyphenyl)-3-(o-chlorostyryl)-5-phenyl-2-pyrazoline,
1-p-biphenylyl-3,5-diphenyl-2-pyrazoline,
1-phenyl-3-(2-naphthyl)-5-p-biphenylyl-2-pyrazoline,
1,3-diphenyl-5-(9-anthryl)-2-pyrazoline,
1- phenyl-3-p-biphenylyl- 5-(2-isopropylphenyl)-2-pyrazoline, and
1,3-diphenyl-5-naphthyl-2-pyrazoline.

The preparation of the compounds is known and is described, for example, in A. Wagner et al, *Angew. Chem.*, Int. Ed., Vol. 5, p. 699 (1966); R. H. Wiley et al, *J. Org. Chem.*, Vol. 23, p. 732 (1958) and N. A. Evans et al, *Aust. J. Chem.*, Vol. 27, p. 2267 (1974).

Suitable hexaarylbisimidazoles are dimers of 2,4,5-triarylimidazole which are bonded via a covalent bond:

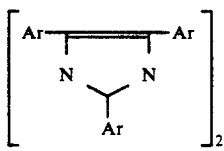

The aryl radicals are preferably phenyl radicals, which can be substituted by halogen atoms, such as chlorine, fluorine or bromine, alkyl groups or alkoxy groups. The aryl groups in the 4- and 5-position can also be bonded to one another. Suitable compounds of this type are, for example, described in U.S. Pat. Nos. 3,479,185 and 3,888,672 and EP 138,187.

Polymerizable compounds suitable for the purposes of the invention are known and are described, for example, in U.S. Pat. Nos. 2,760,863 and 3,060,023.

Preferred examples are acrylic acid esters and methacrylic acid esters of monohydric or preferably polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols, or N-substituted acrylamides and methacrylamides. Advantageously, reaction products of monoisocyanates or diisocyanates with partial esters of polyhydric alcohols are also employed. Such monomers are described in DE 2,064,079, 2,361,041 and 2,822,190.

The proportion of monomers is generally about 10 to 80, preferably about 20 to 60, % by weight, based on the total amount of monomers and binder.

A multiplicity of soluble organic polymers can be used as binders. Examples include polyamides, polyvinyl esters, polyvinyl acetals, polyvinyl ethers, epoxide resins, polyacrylic acid esters, polymethacrylic acid esters, polyesters, alkyd resins, polyacrylamide, polyvinyl alcohol, polyethylene oxide, polydimethylacrylamide, polyvinylpyrrolidone, polyvinylmethylformamide, polyvinylmethylacetamide, and copolymers of the monomers which form the homopolymers listed.

Particularly advantageously, binders are used which are insoluble in water, but soluble or at least swellable in aqueous-alkaline solutions, since layers containing such binders can be developed using the preferred aqueous-alkaline developers. Such binders can contain, for example, the following groups: —COOH, —PO$_3$H$_2$, —SO$_3$H, —SO$_2$NH—, —SO$_2$—NH—SO$_2$ and —SO$_2$—NH—CO—.

Examples of such binders which may be mentioned are: maleate resins, polymers of β-(methacryloyloxy)-ethyl-N-(p-tolyl-sulfonyl)carbamate and copolymers of these and similar monomers with other monomers as well as vinyl acetate/crotonic acid and styrene/maleic anhydride copolymers. Alkyl (meth)acrylate/methacrylic acid copolymers and copolymers of methacrylic acid, higher alkyl (meth)acrylates and methyl methacrylate and/or styrene, acrylonitrile and the like, such as are described in DE 2,064,080 and 2,363,806, are preferred.

The amount of binder is generally about 20 to 90, preferably about 40 to 80, % by weight, based on the amount of monomer and binder.

Depending on the planned application and depending on the desired characteristics, the photopolymerizable mixtures can contain substances of diverse types as additives. These include adhesion promoters, inhibitors to prevent thermal polymerization of the monomers, hydrogen donors, substances which modify the sensitometric properties of such layers, dyestuffs, colored and colorless pigments, color-forming compounds, leuco dyes, indicator dyes and plasticizers, for example, polyglycols or esters of p-hydroxybenzoic acid.

Examples of suitable additives are sulfur compounds, such as mercaptobenzimidazole, mercaptobenzthiazole, imidazole or imidazole derivatives, halogen compounds, such as 2-methyl-4,6-bis-trichloromethyl-s-triazine, [2-(4-styryl-phenyl)]-4,6-bis-trichloromethyl-s-triazine or 2-trichloromethyl-5-styryl-1,3,4-oxadiazole, and compounds containing trivalent phosphorus, such as triphenylphosphine or triphenyl phosphite.

These constituents should be so chosen that they absorb as little as possible in the actinic radiation range which is important for the initiating process.

The photopolymerizable mixture can be used for very diverse applications, for example, for the preparation of coatings which are cured by light, and in particular as a photosensitive recording material in the reproduction field.

The following detailed description of the invention focusses on photosensitive recording applications, but the invention is not restricted to this field. Particular applications within this field include use as recording layers for the photomechanical preparation of printing plates for letterpress printing, planographic printing, rotogravure printing or screen printing, of relief prints, for example, preparation of texts in Braille, and of single copies, tanning patterns, pigment patterns, etc. Furthermore, the mixtures can be used for the photomechanical preparation of etch resists, for example, for the production of nameplates, or of printed circuits and for preform etching. The mixtures according to the invention are particularly important for the photoresist technique, in particular as dry photoresist materials.

The industrial utilization of the mixture for these application purposes can be in the form of a liquid solution or dispersion, for example, in the form of a photoresist solution, which is applied by the user to an individual support, for example, for preform etching or for the production of printed circuits, screen printing templates, and the like. The mixture can also be in the form of a solid photosensitive layer on a suitable support in the form of a storable, pre-coated, photosensitive copying material, for example, for the preparation of printing plates. It is also suitable for the preparation of dry resist.

Suitable coating supports for the copying materials prepared using the mixture according to the invention are, for example, aluminum, steel, zinc and copper foils and plastic films, for example, films made of polyethylene terephthalate or cellulose acetate, as well as screen printing supports, such as perlon gauze.

The preparation of the photosensitive materials using the mixture according to the invention is carried out in a known manner. The mixture can be dissolved in a solvent and the solution or dispersion can be applied to the intended support as a film, by casting, spraying, dipping or by using rollers and the like. Thick coatings, for example, of 250 μm and above, are advantageously produced as a self-supporting film by extruding or pressing, which film is then optionally laminated onto the support. In the case of dry resist, solutions of the mixture are applied to transparent supports and dried. The photosensitive coatings, having a thickness approximately between 10 and 100 μm, are then also laminated onto the desired substrate, initially together with the temporary support.

The processing of the materials is carried out in a known manner. Images are produced by exposure to actinic radiation. Within the framework of this description, actinic radiation is any radiation of an energy which corresponds at least to that of shortwave visible light. Longwave UV radiation, and also laser radiation, is suitable. For developing, the materials are treated with a suitable developer solution, for example, with organic solvents, but preferably with a weakly alkaline, aqueous solution, the unexposed parts of the coating being removed and the exposed areas of the photopolymerizable coating remaining behind on the support.

The following examples illustrate preferred embodiments of the invention. Proportions and percentages are to be understood as units by weight. Parts by weight (pw) and parts by volume (pv) are in the relationship of g to ml.

EXAMPLE 1

Coating solutions were prepared from:
66 pw of a polymer of methacrylic acid, methyl methacrylate, styrene and butyl acrylate (21:42:10:27),
34 pw of the triacrylate of an alkoxylated trimethylolpropane (Laromer ® 8748 from BASF),
0.5 pw of phenyl glycidyl ether,
1.0 pw of leuco crystal violet, and
0.05 pw of Victoria Pure blue FGA (C.I. Basic Blue 81), in
135 pw of butanone, and
80 pw of ethanol.

One of the following photoinitiator additives was incorporated in each of the stock solutions thus obtained:

(a)
  0.5 pw of 1,3,5-triphenyl-pyrazoline
(b)
  0.5 pw of 1,3,5-triphenyl-pyrazoline and
  1.0 pw of benzanthrone
(c)
  0.5 pw of 1,3,5-triphenyl-pyrazoline and
  1.0 pw of 1,2-benzo-9,10-anthraquinone
(d)
  0.5 pw of 1,3,5-triphenyl-pyrazoline and
  1.0 pw of fluorenone
(e)
  0.5 pw of 1,3,5-triphenyl-pyrazoline and
  1.0 pw of triphenylsulfonium tetrafluoroborate
(f)
  0.5 pw of 1,3,5-triphenyl-pyrazoline and
  1.0 pw of diphenyliodonium chloride (g)
  0.5 pw of 1,3,5-triphenyl-pyrazoline and
  1.0 pw of triphenylsulfonium hexafluorophosphate
(h)
  0.5 pw of 1,3,5-triphenyl-pyrazoline, and
  1.0 pw of 2,2'-bis-(o-chlorophenyl)-4,4',5,5'-tetraphenyl-bisimidazole The solutions were applied to 25 μm thick biaxially-stretched and thermofixed polyethylene terephthalate films such that, after drying at 100° C., a coating weight of 45 g/m² was obtained in each case.

In order to protect the dry resist coatings against contamination by dust and against damage, they were covered with a 23 μm thick cover film of polyethylene and rolled up. They could then be stored for a prolonged period with the exclusion of light.

Samples of the dry resist films obtained were laminated in a commercial laminating installation at 115° C. onto phenolic laminated sheets covered with 30 μm thick copper foil and exposed for 8 and 64 seconds using a 5 kW metal halide lamp with a distance of 110 cm between lamp and vacuum printing frame. A 13-step exposure wedge with density increments of 0.15 was used as the original. After exposure, the polyester films were stripped and the coatings were developed in the course of 60 seconds using a 1% sodium carbonate solution in a spray developing apparatus.

The number of cured wedge steps is recorded in the following table:

| Sample | Exposure time (seconds) | |
|---|---|---|
| | 8 | 64 |
| a | 0 | 0 |
| b | 1 | 8 |
| c | 0 | 3 |
| d | 1 | 8 |
| e | 0 | 2 |
| f | 0 | 1 |
| g | 0 | 2 |
| h | 7 | 13 |

Only resist h meets the requirements demanded of a product today.

EXAMPLE 2

One thousand parts by volume of 2 molar sulfuric acid were added to 1 pw of each of the following:
a) 2-p-dimethylaminophenyl-benzoxazole,
b) 2-p-diethylaminophenyl-benzoxazole,
c) 2,5-bis-p-diethylaminophenyl-1,3,4-oxadiazole,
d) 1,3,5-triphenyl-pyrazoline,
e) 1,5-diphenyl-3-styryl-pyrazoline.

C dissolved immediately; a, b, d and e were stirred for 2 hours. The bulk of a and b dissolved giving a pale yellow color; d and e remained undissolved. After filtering, UV spectra of the solutions were recorded between 250 and 450 nm using a UV spectrometer (Perkin-Elmer Lambda 3). In a coating thickness of cm, solutions a and b displayed an absorption of more than 3 between 390 and 360 nm and also below 340 nm, and solution c displayed an absorption of more than 3 below 305 nm. The absorption of the liquids d and e, on the other hand, was less than 0.01 over the entire wavelength range. If solutions a to c are diluted with 2M $H_2SO_4$ in a ratio of 1:100, the resulting solutions a' and b' display an absorption maximum at 295 nm (absorption 0.5) and solution c' displays a maximum at 280 nm (absorption 0.85).

EXAMPLE 3

An amount of 0.2 pw of the co-initiators a to e indicated in Example 2 was added, in each case, to solutions of:

66 pw of a polymer of methacrylic acid, methyl methacrylate, styrene and butyl acrylate (21:41:5:33),
20.4 pw of the triacrylate of ethoxylated trimethylolpropane,
6.8 pw of the diurethane obtained from 2 mol of hydroxyethyl acrylate and 1 mol of 2,2,4-trimethylhexamethylene diisocyanate,
6.8 pw of the reaction product obtained from 1 mol of hydroxyethyl acrylate, 4 mol of ethylene oxide and 1 mol of n-butyl isocyanate,
1 pw of leuco crystal violet,
0.1 pw of the ester obtained from decane diacid (sebacic acid) and 1,2,2,6,6-pentamethyl-4-hydroxypiperidine,
0.2 pw of the soluble phthalocyanine dye Neozapon blue 807 (C.I. 74400) and
2 pw of 2,2'-bis-(o-chlorophenyl)-4,4',5,5'-tetraphenyl-bisimidazole, in
172 pw of butanone, and
45 pw of ethanol.

The resulting solutions 3a to 3e were applied to polyethylene terephthalic film and dried as described in Example 1 to produce a coating weight of 45 g/m$^2$.

The dry resist films were then laminated onto glass plates 10×10 cm in size and exposed for 8 seconds under an original having 150 μm wide lines and 75 μm wide transparent interspaces and then developed by spraying with a 1% sodium carbonate solution to produce a surface which was 33% overlaid with fine resist paths. The plates were then placed in cells each containing 25 ml of 2 molar sulfuric acid. After 2 hours, samples of the sulfuric acid were taken from the cells and their UV spectra were recorded.

Samples a and b displayed a distinct absorption at 295 nm, and sample c a distinct absorption at 280 nm; samples d and e, on the other hand, displayed no additional absorption compared with pure 2 molar sulfuric acid. Accordingly, resists 3d and 3e are less sensitive to acid plating baths and do not contaminate these, or contaminate them only slightly.

EXAMPLE 4

Coating solutions consisting of
50 pw of a copolymer of methyl methacrylate and methacrylic acid (acid number 115),
50 pw of trimethylolpropane triacrylate,
0.1 pw of crystal violet,
1.5 pw of leuco crystal violet,
5 pw of 2,2'-bis-(o-chlorophenyl)-4,4'5,5'tetraphenyl bisimidazole,
3 pw of mercaptobenzthiazole, and
4a) 2.5 pw of 1,3-diphenyl-pyrazoline or
4b) 2.5 pw of 1-phenyl-3-(4-methylstyryl)-5-(4-methylphenyl)-pyrazoline, in
800 pw of butanone
were spin-coated onto electrolytically roughened 0.3 mm thick aluminum hardened by anodizing. The coating was dried for 2 minutes at 100° C., a coating weight of 2.8 g/m$^2$ being obtained.

The plates provided with the photosensitive coating were coated with a 15% strength aqueous solution of polyvinyl alcohol (12% residual acetyl groups, K value 4) and dried to give a top coating of 4 to 5 g/m$^2$.

The printing plates thus obtained were exposed under a negative original for 1 second using a 2 kW metal halide lamp at a distance of 100 cm.

The parts not cured by light were removed by wiping with a developer solution of the following composition:
3 pw of sodium metasilicate×9 H$_2$O,
0.05 pw of strontium chloride,
0.03 pw of non-ionogenic wetting agent (coconut fatty alcohol polyoxy-ethylene ether containing about 8 ethylene oxide units), and
0.003 pw of anti-foam agent, in
100 pw of completely desalinated water.

High performance printing plates for long print runs were obtained both with sample 4a and with 4b.

EXAMPLE 5

A solution of:
54 pw of a polymer consisting of 99% of methyl methacrylate and 1% of acrylic acid,
6.5 pw of o/p-toluene sulfonamide,
0.4 pw of leuco crystal violet,
2 pw of 2,2'-bis-(o-chlorophenyl)-4,4',5,5'-tetraphenyl-bisimidazole,
0.1 pw of 1-phenyl-5-(4'-methylphenyl)-3-(2-naphthyl)-pyrazoline,
0.5 pw of N-phenylglycine,
0.5 pw of a chlorinated copper phthalocyanine (C.I. Pigment Green 7), 3 pw of triethylene glycol diacetate, and
33 pw of the ester obtained from 1 mol of butane-1,4-bis-glycidyl-ether and 2 mol of acrylic acid, in
150 pw of acetone
was applied as in Example 1 to a 25 μm thick biaxially-stretched and thermofixed polyethylene terephthalic film such that, after drying at 100° C., a coating weight of 54 g/m$^2$ was obtained. The dry resist film was laminated in a commercial laminating installation at 115° C. onto a phenolic laminated plate covered with 35 μm thick copper foil and exposed for 9 seconds using a 5 kW metal halide lamp at a distance of 110 cm between lamp and vacuum printing frame. A line original with 50 μm wide lines and 50 μm spacings was used as the original. After exposure, the polyester film was stripped and the coating was developed in the course of 60 seconds using 1,1,1-trichloroethane in a spray developing apparatus.

An outstanding reproduction of the fine lines was obtained, i.e., the resist is distinguished by a very good resolution.

What is claimed is:

1. A photopolymerizable mixture consisting essentially of, in admixture;
   (a) a polymer binder,
   (b) a polymerizable compound having at least one terminal ethylenic double bond and a boiling point above about 100° C. at normal pressure, wherein polymer binder (a) is present in amount of about 20 to 90% by weight relative to the total amount of (a) and (b) and compound (b) is present in an amount of about 10 to 80% by weight relative to the total amount of (a) and (b),
   (c) from about 0.1 to 20% by weight, based on the amount of polymerizable compound (b), of a hexaarylbisimidazole, and
   (d) from about 0.01 to 10% by weight, based on the amount of polymerizable compound (b), of a pyrazoline selected from the group consisting of 1,3-diarylpyrazoline and 1-aryl-3-aralkenylpyrazoline as a further photoinitiator.

2. The mixture as claimed in claim 1, wherein the pyrazoline has the general formula I

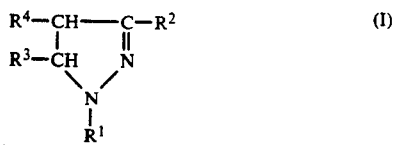

wherein

R¹ is a monocyclic to tricyclic aryl radical,

R² is a radical having the meaning of R¹ or an aralkenyl radical,

R³ is a hydrogen atom, an alkyl radical or a radical having the meaning of R¹, and R⁴ is a hydrogen atom or an alkyl radical.

3. A mixture as claimed in claim 2, wherein R² is selected from the group consisting of a phenyl radical, a substituted phenyl radical, a styryl radical and a substituted styryl radical.

4. A mixture as claimed in claim 2, wherein R¹ is selected from the group consisting of a phenyl radical and a substituted phenyl radical.

5. A mixture as claimed in claim 1, additionally comprising a leuco dye.

6. A mixture as claimed in claim 1, wherein the polymerizable compound (b) is one of an acrylic acid ester and a methacrylic acid ester.

7. A photopolymerizable recording material comprising a coating support and a photopolymerizable coating, wherein the coating consists of a mixture as claimed in claim 1.

8. A mixture as claimed in claim 1, wherein the polymer binder is an alkali-soluble binder.

9. A mixture as claimed in claim 8, wherein the polymer binder is selected from the group consisting of polyacrylic esters and polymethacrylic esters.

10. A mixture as claimed in claim 8, wherein the polymer binder contains a group selected from the group consisting of —COOH, —PO₃H₂, —SO₃H, —SO₂NH—, —SO₂—NH—SO₂ and —SO₂—NH—CO—.

11. A mixture as claimed in claim 8, wherein the polymer binder is selected from the group consisting of maleate resins, polymers of β-(methacryloyloxy)-ethyl-N-(p-tolyl-sulfonyl)-carbamate, vinyl acetate/crotonic acid copolymers and styrene/maleic anhydride copolymers.

12. A mixture as claimed in claim 1, wherein compound (b) is a reaction product of a monoisocyanate or diisocyante with a partial ester of a polyhydric alcohol.

13. A mixture as claimed in claim 1, wherein the amount of compound (b) is about 20 to 60% by weight relative to the total amount of (a) and (b).

14. A mixture as claimed in claim 1, wherein the amount of polymer binder is about 40 to 80% by weight relative to the total amount of (a) and (b).

15. A mixture as claimed in claim 1, wherein the hexaarylbisimidazole is a covalently-bonded dimer of 2,4,5-triarylimidazole.

16. A mixture as claimed in claim 1, wherein the hexaarylbisimidazole is a covalently-bonded dimer of 2,4,5-triphenylimidazole.

17. A mixture as claimed in claim 1, wherein the amount of compound (d) is about 0.1 to 1% by weight, based on the amount of polymerizable compounds.

* * * * *